United States Patent
Ge et al.

(10) Patent No.: US 11,423,277 B2
(45) Date of Patent: Aug. 23, 2022

(54) FLUIDIC CONDUCTIVE TRACE BASED RADIO-FREQUENCY IDENTIFICATION

(71) Applicant: HEWLETT-PACKARD DEVELOPMENT COMPANY, L.P., Houston, TX (US)

(72) Inventors: Ning Ge, Palo Alto, CA (US); Jarrid Wittkopf, Palo Alto, CA (US); Robert Ionescu, Palo Alto, CA (US); Helen A. Holder, Palo Alto, CA (US); Paul Howard Mazurkiewicz, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 1052 days.

(21) Appl. No.: 16/076,273

(22) PCT Filed: Feb. 7, 2017

(86) PCT No.: PCT/US2017/016856
§ 371 (c)(1),
(2) Date: Aug. 7, 2018

(87) PCT Pub. No.: WO2018/147835
PCT Pub. Date: Aug. 16, 2018

(65) Prior Publication Data
US 2021/0182647 A1    Jun. 17, 2021

(51) Int. Cl.
*G06K 19/077*    (2006.01)
*G06K 19/067*    (2006.01)
(Continued)

(52) U.S. Cl.
CPC .... *G06K 19/07749* (2013.01); *G06K 19/0672* (2013.01); *H01Q 1/2208* (2013.01);
(Continued)

(58) Field of Classification Search
CPC ............................................... G06K 19/07749
(Continued)

(56) References Cited

U.S. PATENT DOCUMENTS 6,025,725 A    2/2000   Gershenfeld et al.
7,986,236 B2   7/2011   Erikson
(Continued)

FOREIGN PATENT DOCUMENTS

RU    2457472 C2      7/2012
WO    2014055559 A1   4/2014

OTHER PUBLICATIONS

Hasan, "New Graphene Based Inks for High-Speed Manufacturing of Printed Electronics", Retrieved from internet—https://www.cam.ac.uk/research/news/new-graphene-based-inks-for-high-speed-manufacturing-of-printed-electronics, Oct. 19, 2015, 5 Pages.

*Primary Examiner* — Rafferty D Kelly
(74) *Attorney, Agent, or Firm* — Mannava & Kang

(57) ABSTRACT

In some examples, a fluidic conductive trace based radio-frequency identification device may include a flexible substrate layer including a channel, and a trace formed of a conductive fluid that is disposed substantially within the channel. The fluidic conductive trace based radio-frequency identification device may further include a sealing layer disposed on the flexible substrate layer and the trace to seal the conductive fluid in a liquid state within the channel.

15 Claims, 6 Drawing Sheets

(51) Int. Cl.
*H01Q 1/22* (2006.01)
*H01Q 1/38* (2006.01)
*H04B 5/00* (2006.01)
*H05K 1/03* (2006.01)
*H05K 1/09* (2006.01)

(52) U.S. Cl.
CPC ............ *H01Q 1/38* (2013.01); *H04B 5/0062* (2013.01); *H04B 5/0081* (2013.01); *H05K 1/0393* (2013.01); *H05K 1/092* (2013.01); *H05K 2201/10098* (2013.01)

(58) Field of Classification Search
USPC ....................................................... 235/492
See application file for complete search history.

(56) References Cited

U.S. PATENT DOCUMENTS

| | | |
|---|---|---|
| 9,159,018 B2 | 10/2015 | Coleman et al. |
| 2007/0007661 A1 | 1/2007 | Burgess et al. |
| 2008/0007409 A1 | 1/2008 | Ferry et al. |
| 2010/0097284 A1* | 4/2010 | Brannan ............ A61B 18/1815 343/793 |
| 2010/0323102 A1 | 12/2010 | Chopra et al. |
| 2013/0002438 A1 | 1/2013 | Kaensaekoski et al. |
| 2015/0207215 A1* | 7/2015 | Dickey ................. H01Q 1/364 29/600 |

* cited by examiner

FLUIDIC CONDUCTIVE TRACE BASED RADIO-FREQUENCY IDENTIFICATION

BACKGROUND

Radio-frequency identification (RFID) may use electromagnetic fields to identify and track tags attached to objects. The tags may include electronically stored information. Examples of tags include passive tags that collect energy from a nearby RFID reader's interrogating radio waves, and active tags that include a local power source such as a battery. RFID tags may be used in many industries, such as shops, automotive, pharmaceutical, farming, etc.

BRIEF DESCRIPTION OF DRAWINGS

Features of the present disclosure are illustrated by way of example and not limited in the following figure(s), in which like numerals indicate like elements, in which.

DETAILED DESCRIPTION

Figure 1:
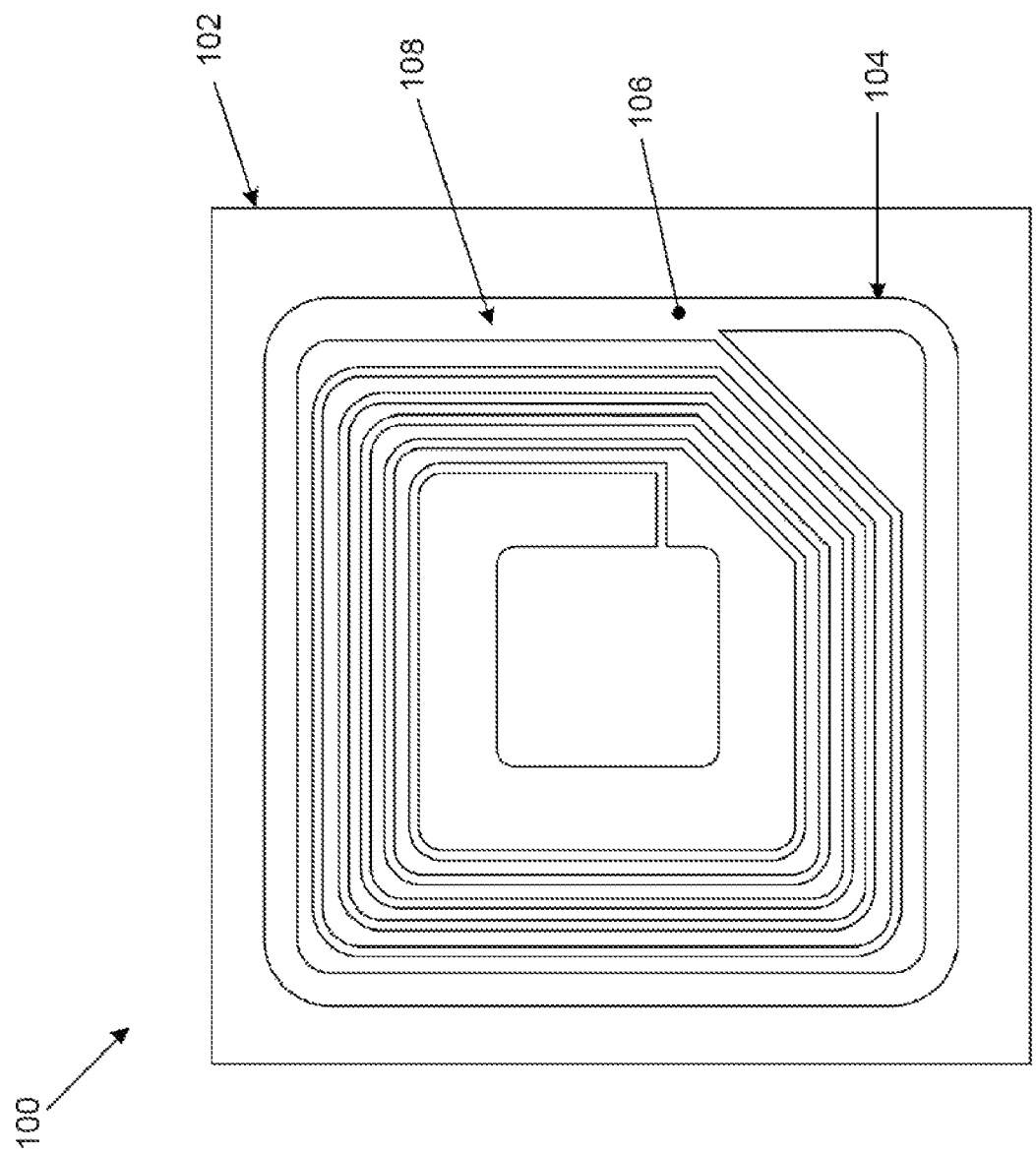
FIG. 1 illustrates a layout of a fluidic conductive trace based radio-frequency identification (RFID) device, according to an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

A fluidic conductive trace based radio-frequency identification (RFID) device, and a method for forming a fluidic conductive trace based RFID device are disclosed herein. According to an example, the disclosed RFID device may include a flexible (or non-flexible) substrate layer including a channel, and a trace formed of a conductive fluid that is disposed substantially within the channel. The trace may be configured in a pattern to form an antenna or part of an antenna. A sealing layer may be disposed on the flexible substrate layer and the trace to seal the conductive fluid in a liquid state within the channel. The conductive fluid and the sealing layer may include properties such that the conductive fluid interacts with the sealing layer, and actuation of the antenna may generate an indication of an attribute of the RFID device. For example, actuation of the antenna may generate an indication of whether the RFID device is operational or nonoperational based on a current state of the conductive fluid (e.g., where a current state of the conductive fluid is liquid, semi-liquid, solid, etc.). Actuation of the antenna may also generate an indication of a status of the RFID device on a scale, for example, of 1-10, where the scale may correspond to a current state of the conductive fluid based on the interaction of the conductive fluid with the sealing layer from a point in time when the conductive fluid is sealed in the channel to a time when the current state is ascertained. In this regard, such a scale may be used to provide an indication of a life of an associated product (e.g., state 10 represents a life of x months, state 9 represents a remaining life of y months, etc.). Actuation of the antenna may also generate an indication of whether the RFID device has been tampered with based on whether the RFID device is operational or nonoperational based on a current state of the conductive fluid (e.g., where a current state of the conductive fluid is liquid, semi-liquid, solid, etc.), where tampering may result in leakage of the conductive fluid from within the sealed channel. The RFID device may be a RFID tag, or include or be a component of a RFID tag that may be actuated by electromagnetic waves of a RFID reader, or may otherwise communicate with a RFID reader or another device used with RFID tags.

FIG. 1 illustrates a layout of a fluidic conductive trace based radio-frequency identification device (hereinafter also referred to as "device 100"), according to an example of the present disclosure.

Referring to FIG. 1, the device 100 may include a flexible substrate layer 102 including a channel 104. The flexible substrate layer 102 may be formed of materials such as Polydimethylsiloxane (PDMS), etc.

The device 100 may further include a trace 106 formed of a conductive fluid 108 that is disposed substantially within the channel 104. In the example of FIG. 1, the trace 106 may form a generally larger width square shaped pattern along the outer boundaries, and generally smaller width square shaped patterns within the boundaries defined by the generally larger width square shaped pattern. A variety of other patterns may be formed without departing from the scope of the device 100 of FIG. 1. For example, triangular, rectangular, and other geometrically shaped patterns may be formed without departing from the scope of the device 100 of FIG. 1. Generally, the pattern of the trace 106 may be defined based on a specific encoding that is associated with the device 100 to identify the device 100.

The conductive fluid 108 may include fluids such as Potassium chloride (KCl) solution (0.1 n) including a conductivity of approximately 1.05 siemens per meter (S/m), Sodium Chloride (NaCl) solution (saturated) including a conductivity of approximately 20.14 S/m, Sodium hydroxide (NaOH) solution (saturated) including a conductivity of approximately 41.2 S/m, Hydrogen chloride (HCl) (saturated) including a conductivity of approximately 852000 S/m, Ethyl alcohol including a conductivity of approximately $3.3 \times 10^{-4}$ S/m, deionized (DI) water including a conductivity of approximately $2 \times 10^{-4}$ S/m, poly(3,4-ethylenedioxythiophene) polystyrene sulfonate (PDOT:PSS) including a conductivity of approximately $4.6 \times 10^5$ S/m, and other such conductive fluids.

According to an example, the conductive fluid 108 may emulate chipped or passive chipless RFID trace resonance. For example, a chipless RFID design may remove a chip (compared to a chipped RFID that includes an antenna connected to a silicon chip), and store a unique signature in the electromagnetic resonance of a conductive trace. Thus, for the device 100, a unique signature in the electromagnetic resonance may be stored in the conductive trace 106.

Figure 5:
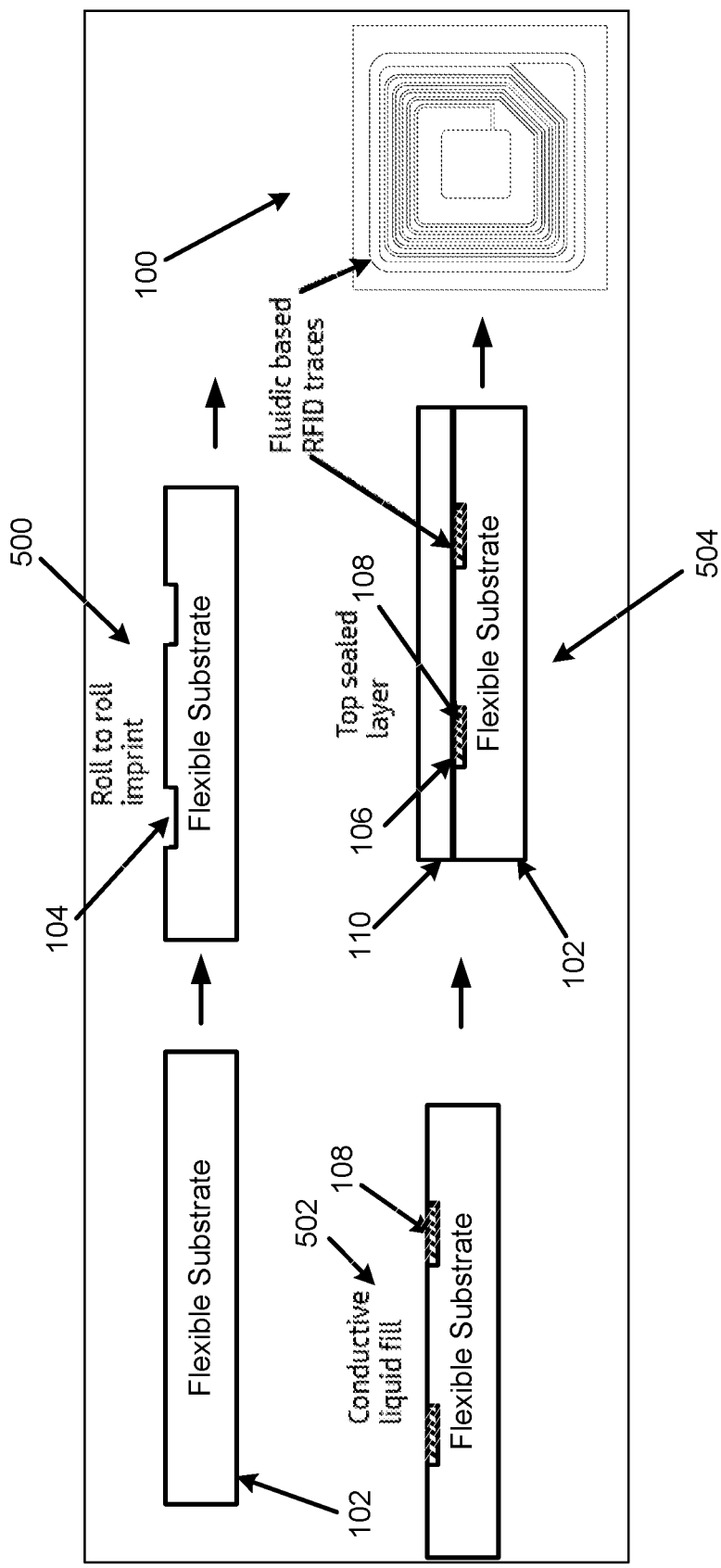
FIG. 5 illustrates a step-by-step process for forming the RFID device of FIGS. 1 and/or 2, according to an example of the present disclosure.

Referring to FIGS. 1 and 5, the device 100 may further include a sealing layer 110 (see FIG. 5) disposed on the flexible substrate layer 102 and the trace 106 to seal the conductive fluid 108 in a liquid state within the channel 104. For example, the sealing layer 110 may be deposited on the flexible substrate layer 102 and the trace 106 to seal the conductive fluid 108 in a liquid state within the channel 104. The sealing layer 110 may be formed of a polymer, and other such materials.

According to an example, the conductive fluid 108 may include a predetermined conductivity based on a predetermined conductive fluid property. For example, the predetermined conductive fluid property may include a concentration of conductive particles in the conductive fluid 108 for a specified volume. For example, DI water may include a conductivity of approximately $2 \times 10^{-4}$ S/m based on a predetermined conductive fluid property associated with the concentration of dissociated ions in the solution. The degree of dissociation and the chemical properties of the ionic molecules may determine the overall conductivity of the solution.

The predetermined conductive fluid property may include a predetermined change over a predetermined time period based on an interaction of the conductive fluid 108 with the sealing layer 110. For example, assuming that the device 100 includes a specified life of six months (i.e., an engineered life of six months), the predetermined conductive fluid property may include a predetermined reduction in the conductivity of the conductive fluid 108 over the six month period based on an interaction of the conductive fluid 108 with the sealing layer 110. In this regard, the concentration of conductive particles in the conductive fluid 108 for a specified volume may be based on the predetermined reduction in the conductivity of the conductive fluid 108 over the six month period based on an interaction of the conductive fluid 108 with the sealing layer 110. For example, the sealing layer 110 may include a specific diffusion material property that interacts with the conductive fluid 108 to reduce the conductivity of the conductive fluid 108. In this regard, the sealing layer 110 may include functionalized polymers or porous ceramics such as zeolites to specifically absorb or ion exchange the conductive ions of the conductive fluid 108 with less conductive counterparts, or include ionic species with lower maximum concentrations which would reduce conductivity through precipitation. According to another example, the sealing layer 110 may include a specific diffusion coefficient that changes based on the interaction of the conductive fluid 108 with the sealing layer 110 to reduce the conductivity of the conductive fluid 108.

According to an example, for a particular example of DI water, the conductive fluid 108 may include DI water including a predetermined conductivity based on a predetermined DI water property, based, for example, on the addition of a polymer coating that has desiccating functional groups or additives. Further, the predetermined DI water property may include a predetermined change over a predetermined time period based on an interaction of the DI water with the sealing layer 110. For example, the sealing layer 110 may include a specific diffusion material property that interacts with the DI water to reduce the conductivity of the DI water. According to another example, the sealing layer 110 may absorb the DI water, leaving dissolved solute.

According to an example, the sealing layer 110 may include a predetermined sealing layer property that causes a predetermined change in the predetermined conductive fluid property. For example, the predetermined sealing layer property may include a porosity of the sealing layer 110 that causes absorption and/or evaporation of the conductive fluid 108. For example, the porosity of the sealing layer 110 may be specified such that the conductive fluid 108 evaporates from a liquid state, to a semi-liquid state (e.g., based on a viscosity of the conductive fluid 108), to a solid state (or other states) in a predetermined time period. For example, assuming that the device 100 includes a specified life of six months, the porosity of the sealing layer 110 may be specified such that the conductive fluid 108 evaporates from a liquid state at up to five months, to form a semi-liquid state at up to six months, to form a solid state (or other states) beyond six months. In this manner, actuation of the RFID device 100 may cause generation of an indication of a predetermined attribute of the device 100 from a plurality of predetermined attributes of the device 100 based on a state of the conductive fluid 108 during actuation of the device 100. For example, actuation of the RFID device 100 may cause generation of an indication of a pass associated with the device 100 from pass, semi-pass, or fail options (or other options) for the device 100 based on a liquid state of the conductive fluid 108 during actuation of the device 100. The semi-pass option may be designated as a warning of an impending failure (or expiration) associated with the device 100. Thus, with respect to a porous sealing layer 110 which allows the conductive fluid 108 to slowly absorb over the lifetime of the device 100, once the conductive fluid 108 is absorbed, the device 100 may effectively shut off after an engineered period of time. Examples of materials for the porous sealing layer 110 may include porous polymers designed with porosities that will slowly absorb the conductive fluid 108 at a specified rate.

According to another example, the predetermined sealing layer property may include a porosity or another material property of the sealing layer 110 that causes degradation of the sealing layer 110 due to the interaction of the sealing layer 110 with the conductive fluid 108. For example, the porosity or another material property of the sealing layer 110 may be specified such that the conductive fluid 108 interacts with the sealing layer 110 to degrade the sealing layer 110 to effectively reduce a conductivity of the conductive fluid 108 and/or reduce a level of RFID signals that are to be transmitted by the trace 106.

According to another example, the predetermined sealing layer property may cause a reduction of the predetermined conductivity of the conductive fluid 108 over the predetermined time period based on the interaction of the conductive fluid 108 with the sealing layer 110. In this regard, the predetermined conductive fluid property may include the predetermined change over a predetermined time period based on an interaction of the conductive fluid 108 with the sealing layer 110. For example, the predetermined sealing layer property may be associated with a diffusion rate at which conductive fluid particles diffuse into the sealing layer 110 to cause a reduction of the predetermined conductivity of the conductive fluid 108 over the predetermined time period based on the interaction of the conductive fluid 108 with the sealing layer 110. For example, with respect to DI water, the predetermined sealing layer property may be associated with a diffusion rate at which the DI water particles diffuse into the sealing layer 110 to cause a reduction of the predetermined conductivity of the DI water over the predetermined time period (e.g., six months) based on the interaction of the DI water with the sealing layer 110. The DI water may diffuse into the sealing layer 110, for example, due to the hydrophilic nature of the sealing material. The sealing layer 110 may be tailored to include an affinity to water, leading to a controlled diffusion into the bulk of the sealing material at a predetermined time duration corresponding to the life of the device 100.

According to an example, the trace 106 may include a configuration that causes generation of an indication of a predetermined attribute of the device 100 from a plurality of predetermined attributes of the device 100 based on a state of the conductive fluid 108 during actuation of the device 100. For example, as shown in FIG. 1, the trace 106 may include a generally square configuration, and a specified size that causes generation of an indication of a pass state of the device 100 from a plurality of predetermined attributes (e.g., pass, semi-pass, fail, etc.) of the device 100 based on a liquid state of the conductive fluid 108 (e.g., from liquid, semi-liquid, or solid states) during actuation of the device 100.

According to an example, actuation of the device 100 may generate an indication of whether the device 100 is operational or nonoperational based on a current state of the conductive fluid 108 (e.g., where a current state of the conductive fluid is liquid, semi-liquid, solid, etc.). Actuation of the device 100 may also generate an indication of a status of the device 100 on a scale, for example, of 1-10, where the scale may correspond to a current state of the conductive fluid 108 based on the interaction of the conductive fluid 108 with the sealing layer 110 from a point in time when the conductive fluid is sealed in the channel to a time when the current state is ascertained. In this regard, such a scale may be used to provide an indication of a life of an associated product (e.g., state 10 represents a life of x months, state 9 represents a remaining life of y months, etc.).

For example, the trace 106 may include a configuration that causes generation of an indication of a predetermined attribute of a product associated with the device 100 from a plurality of predetermined attributes of the product associated with the device 100 based on a state of the conductive fluid 108 during actuation of the device 100. For example, as shown in FIG. 1, the trace 106 may include a generally square (or another) configuration, and a specified size that causes generation of an indication of a fail (or expiration) associated with a product (e.g., any type of consumer product, such as, food, electronics, licensed products, perishables, etc.) associated with the device 100 from a plurality of predetermined attributes (e.g., pass, semi-pass, fail, expired, valid, invalid, etc.) of the product associated with the device 100 based on a state (e.g., solid, or liquid but ion depleted, etc.) of the conductive fluid 108 during actuation of the device 100.

With respect to sizes, the device 100 may be sized based on factors such as usage, associated product, environmental factors, etc. For example, the channel 104 may include dimensions of 10 μm to a few millimeters.

Figure 2:
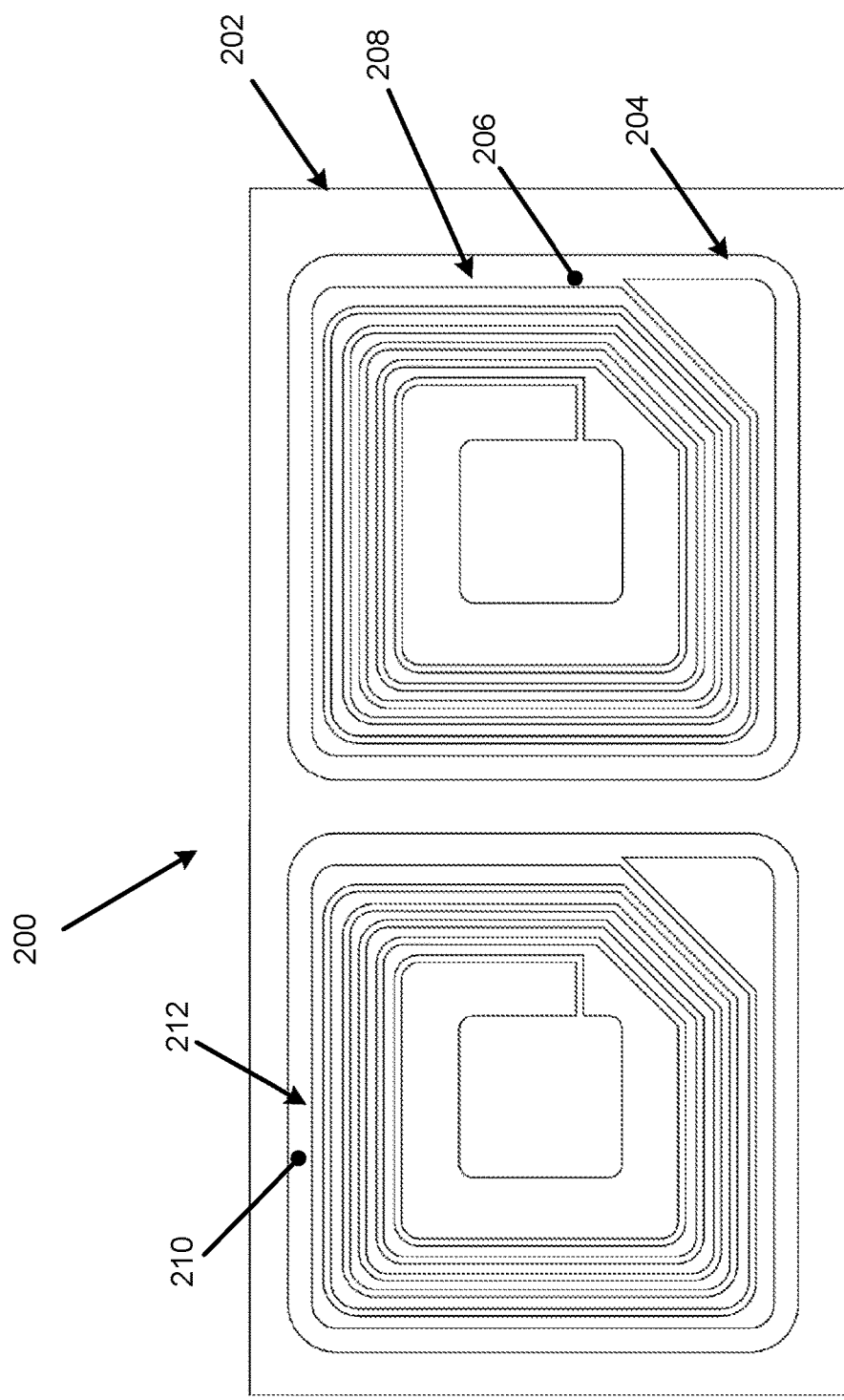
FIG. 2 illustrates a layout of another fluidic conductive trace based RFID device, according to an example of the present disclosure.

FIG. 2 illustrates a layout of another fluidic conductive trace based RFID device 200, according to an example of the present disclosure.

Referring to FIG. 2, according to an example, the device 200 may include a substrate layer 202 including a channel 204, and a first trace 206 formed of a conductive fluid 208 (e.g., the conductive fluid 108) that is disposed substantially within the channel 204. Further, the device 200 may include a second trace 210 formed of a metallic material 212, such as Copper, etc. In the example of FIG. 2, the first trace 206 is shown as a separate trace compared to the second trace 210. However, the first and second traces may be formed so that they contiguously engage each other, and in this regard, their operations may be dependent or independent from each other. For example, the metallic trace 210 may provide for relatively high frequency operation, whereas the conductive fluid trace 206 may provide a relatively low frequency operation associated with tampering, product expiration, etc., as disclosed herein. A sealing layer (similar to the sealing layer 110) may be disposed on the substrate layer 202 and the first trace 206 to seal the conductive fluid 208 in a liquid state within the channel 204. Further, the sealing layer (similar to the sealing layer 110) may be disposed on the substrate layer 202 and the second trace 210. In this regard, the same or a different sealing layer may be used to seal the first and/or second traces.

The device 100 and/or 200 may be formed of transparent or semi-transparent materials. For example, for the device 100, the substrate layer 102, the conductive fluid 108, and the sealing layer 110 may be formed of transparent or semi-transparent materials. Similarly, for the device 200, the substrate layer 202, the conductive fluid 208, and the sealing layer 110 may be formed of transparent or semi-transparent materials. Further, the device 100 and/or 200 may be formed of biodegradable and environmentally friendly materials.

Figure 3:
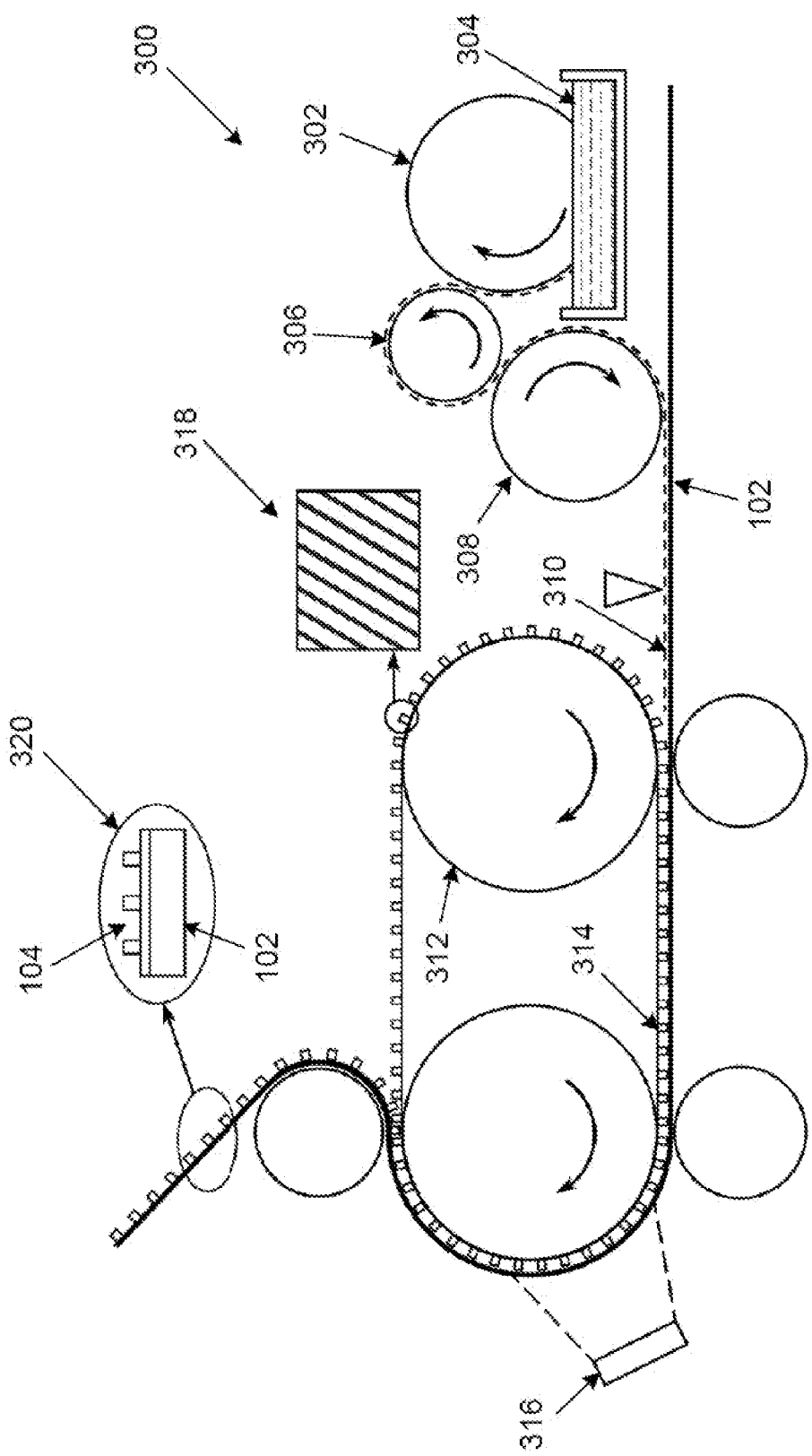
FIG. 3 illustrates a roll to roll manufacturing technique for forming the RFID device of FIGS. 1 and/or 2, according to an example of the present disclosure.

FIG. 3 illustrates a roll to roll manufacturing technique for forming the RFID device of FIGS. 1 and/or 2, according to an example of the present disclosure.

Referring to FIG. 3, the roll to roll manufacturing technique of FIG. 3 may represent a roll to roll imprint process for formation of the device 100 and/or 200. The roll to roll manufacturing technique may start at 300 where a coating roller 302 in contact with liquid resist 304 transfers the liquid resist onto rollers 306 and 308, which then transfer the liquid resist 304 onto the flexible substrate layer 102 (and 202). A layer of the liquid resist at 310 may be imprinted by rollers 312 and 314, and further cured by an ultraviolet (UV) source at 316. The mold 318 associated with the rollers 312 and 314 may be formed to imprint the channel 104 (and 204) into the substrate layer 102 (and 202). The mold 318 may be formed of an Ethylene tetrafluoroethylene (ETFE) material, and other such materials. The imprinted layer at 320 may represent the flexible substrate layer 102 (and 202) which includes the imprinted channel 104 (and 204).

Figure 4:
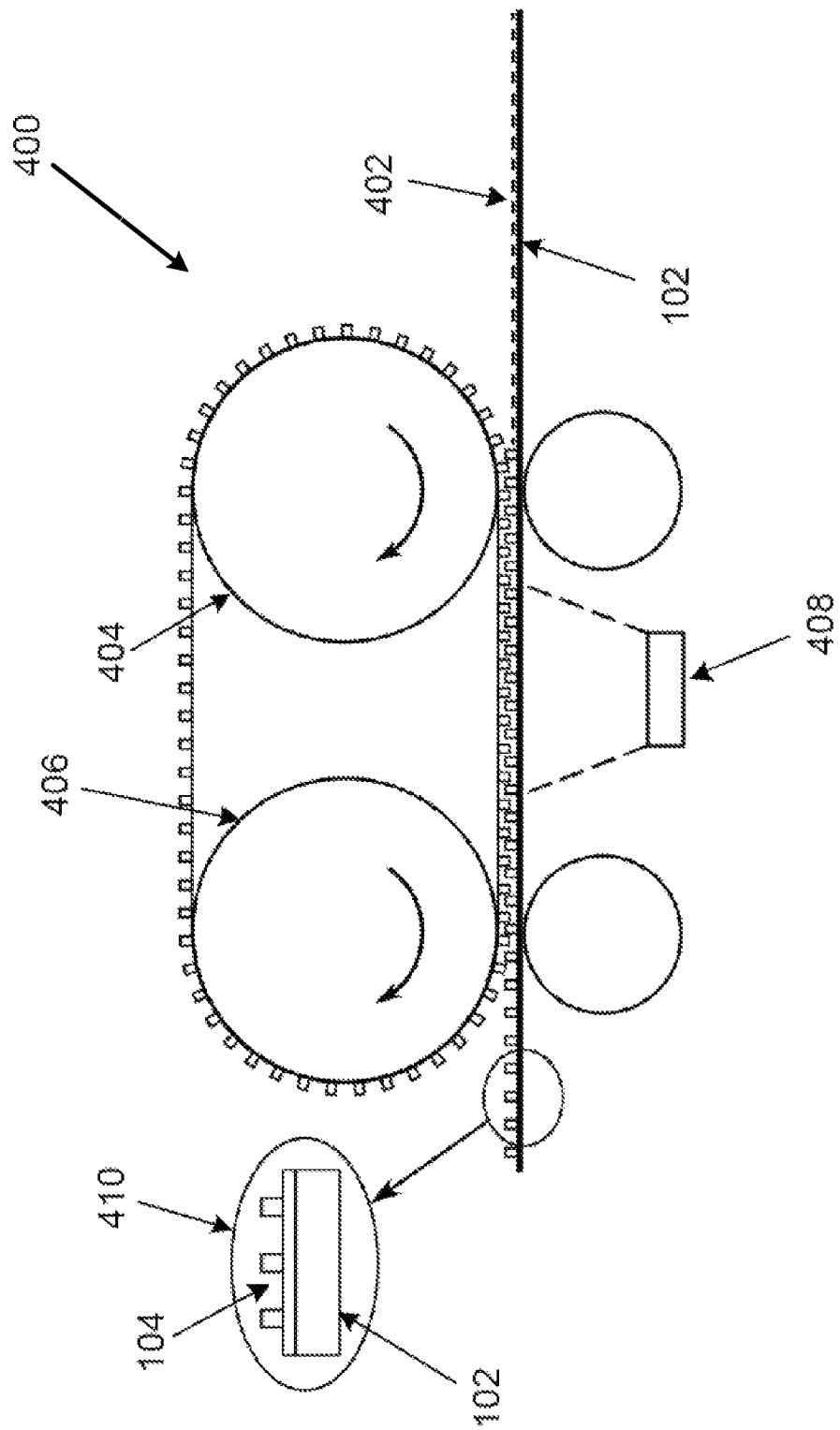
FIG. 4 illustrates another roll to roll manufacturing technique for forming the RFID device of FIGS. 1 and/or 2, according to an example of the present disclosure.

FIG. 4 illustrates another roll to roll manufacturing technique for forming the RFID device of FIGS. 1 and/or 2, according to an example of the present disclosure.

Referring to FIG. 4, the roll to roll manufacturing technique of FIG. 4 may represent a roll to roll imprint process for formation of the device 100 and/or 200. The roll to roll manufacturing technique may start at 400 where a layer of liquid resist at 402 on the substrate layer 102 (and 202) may be imprinted by rollers 404 and 406, and further cured by a UV source at 408. The imprinted layer at 410 may represent the flexible (or rigid) substrate layer 102 (and 202) which includes the imprinted channel 104 (and 204).

With respect to the roll to roll manufacturing techniques of FIGS. 3 and 4, other techniques such as nano-imprinting may be used without departing from the scope of the techniques described with respect to FIGS. 3 and 4. Further, the roll to roll manufacturing techniques of FIGS. 3 and 4 may represent in-situ processes where the entire device 100 and/or 200 are produced from start to finish, without components of the device 100 and/or 200 needing to be transferred between different machines.

FIG. 5 illustrates a step-by-step process for forming the RFID device of FIGS. 1 and/or 2, according to an example of the present disclosure.

Referring to FIG. 5, at 500, a flexible (or rigid) substrate layer 102 may be imprinted by the techniques of FIG. 4 or 5 to form the channel 104. At 502, the conductive fluid 108 may be disposed into the channel 104. At 504, the sealing layer 110 may be disposed on the flexible substrate layer 102 and the trace 106 to seal the conductive fluid 108 in a liquid state within the channel 104.

Figure 6:
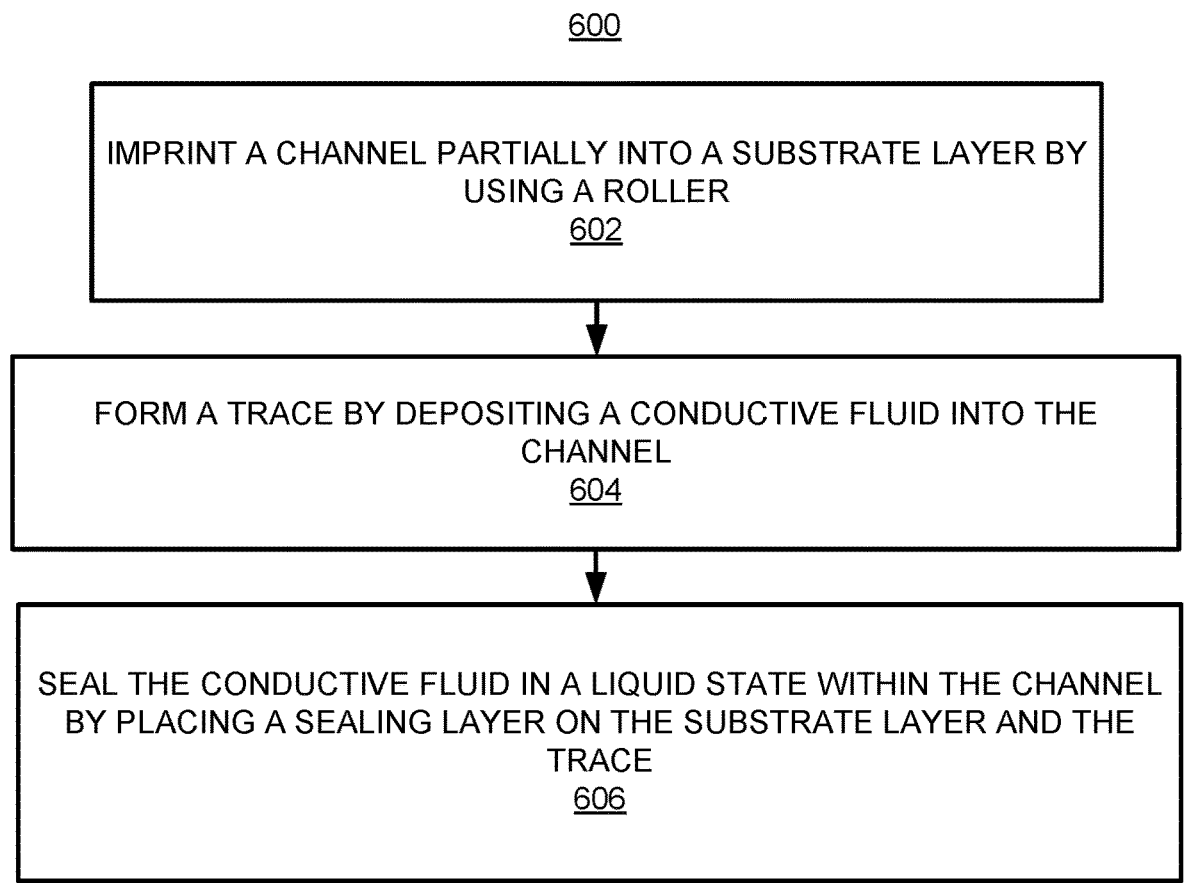
FIG. 6 illustrates a flowchart of a method for forming a fluidic conductive trace based RFID device, according to an example of the present disclosure.

FIG. 6 illustrates a flowchart of a method for forming a fluidic conductive trace based RFID device, according to an example of the present disclosure.

Referring to FIGS. 1-6, and particularly FIG. 6, for the method 600, at block 602, the method may include imprinting a channel 104 partially into a substrate layer 102 by using a roller such as the rollers 312, 314, 404, and/or 406 of FIG. 3 or 4.

At block 604, the method may include forming a trace 106 by depositing a conductive fluid 108 into the channel 104 (e.g., see also discussion with respect to FIG. 5).

At block 606, the method may include sealing the conductive fluid 108 in a liquid state within the channel 104 by placing a sealing layer 110 on the substrate layer 102 and the trace 106 (e.g., see also discussion with respect to FIG. 5).

According to an example, for the method 600, the conductive fluid 108 may include a predetermined conductivity based on a predetermined conductive fluid property. Further, the predetermined conductive fluid property may include a predetermined change over a predetermined time period based on an interaction of the conductive fluid 108 with the sealing layer 110. In this regard, the method 600 of FIG. 6 may further include configuring the trace 106 (or 206) to generate an indication of a predetermined attribute of the device 100 (or the device 200) from a plurality of predetermined attributes of the device 100 (or the device 200) based on a state of the conductive fluid 108 during actuation of the device 100 (or the device 200).

According to an example, the method 600 of FIG. 6 may further include configuring the trace 106 (or 206) to generate an indication of a predetermined attribute of a product associated with the device 100 (or the device 200) from a plurality of predetermined attributes of the product associated with the device 100 (or the device 200) based on a state of the conductive fluid 108 during actuation of the device 100 (or the device 200).

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A radio-frequency identification device comprising:
   a substrate layer including a channel;
   a trace formed of a conductive fluid that is disposed substantially within the channel, wherein the conductive fluid in the channel includes deionized water having a predetermined conductivity; and
   a sealing layer disposed on the substrate layer and the trace to seal the conductive fluid in a liquid state within the channel, wherein the sealing layer has a specific diffusion material property that interacts with the deionized water in the channel to reduce the predetermined conductivity of the deionized water in the channel over a predetermined time period.

2. The radio-frequency identification device according to claim 1, wherein the predetermined conductivity of the deionized water is determined based on a predetermined conductive fluid property, and
   the predetermined conductive fluid property includes a predetermined change over the predetermined time period based on an interaction of the conductive fluid with the sealing layer.

3. The radio-frequency identification device according to claim 1, wherein the substrate layer is a flexible material.

4. The radio-frequency identification device according to claim 1, wherein the substrate layer is a rigid material.

5. The radio-frequency identification device according to claim 1, wherein the sealing layer includes a porosity that causes evaporation of the conductive fluid.

6. The radio-frequency identification device according to claim 1, wherein the sealing layer absorbs conductive ions in the deionized water to reduce the predetermined conductivity of the deionized water over the predetermined time period.

7. The radio-frequency identification device according to claim 1, wherein the trace includes a configuration that causes generation of an indication of a predetermined attribute of the radio-frequency identification device based on a state of the conductive fluid during actuation of the radio-frequency identification device.

8. The radio-frequency identification device according to claim 1, wherein the trace includes a configuration that causes generation of an indication of a predetermined attribute of a product associated with the radio-frequency identification device based on a state of the conductive fluid during actuation of the radio-frequency identification device.

9. A radio-frequency identification device comprising:
   a substrate layer including a channel;
   a first trace formed of a conductive fluid that is disposed substantially within the channel, wherein the conductive fluid in the channel includes deionized water having a predetermined conductivity;
   a second trace formed of a metallic material on the substrate layer; and
   a sealing layer disposed on the substrate layer and the first trace to seal the conductive fluid in a liquid state within the channel, wherein the sealing layer has a specific diffusion material property that interacts with the deionized water in the channel to reduce the predetermined conductivity of the deionized water in the channel over a predetermined time period.

10. The radio-frequency identification device according to claim 9, wherein the sealing layer is disposed on the substrate layer and the second trace.

11. The radio-frequency identification device according to claim 9, wherein the substrate layer is a flexible material.

12. The radio-frequency identification device according to claim 9, wherein the sealing layer includes a porosity that causes evaporation of the conductive fluid.

13. A method for forming a radio-frequency identification device, the method comprising:
    imprinting a channel partially into a substrate layer by using a roller;
    forming a trace by depositing a conductive fluid into the channel, wherein the conductive fluid in the channel includes deionized water having a predetermined conductivity; and
    sealing the conductive fluid in a liquid state within the channel by placing a sealing layer on the substrate layer and the trace, wherein the sealing layer has a specific diffusion material property that interacts with the deionized water in the channel to reduce the predetermined conductivity of the deionized water in the channel over a predetermined time period.

14. The method according to claim 13, further comprising:
configuring the trace to generate an indication of a predetermined attribute of the radio-frequency identification device based on a state of the conductive fluid during actuation of the radio-frequency identification device.

15. The method according to claim 13, further comprising:
configuring the trace to generate an indication of a predetermined attribute of a product associated with the radio-frequency identification device based on a state of the conductive fluid during actuation of the radio-frequency identification device.

\* \* \* \* \*